(12) United States Patent
Tomita

(10) Patent No.: US 7,719,078 B2
(45) Date of Patent: May 18, 2010

(54) SEMICONDUCTOR DEVICE AND METHOD OF PRODUCING THE SAME

(75) Inventor: Kazuo Tomita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/265,430

(22) Filed: Nov. 5, 2008

(65) Prior Publication Data

US 2009/0072345 A1 Mar. 19, 2009

Related U.S. Application Data

(60) Continuation of application No. 11/889,101, filed on Aug. 9, 2007, now Pat. No. 7,550,815, which is a continuation of application No. 11/135,316, filed on May 24, 2005, now Pat. No. 7,304,365, which is a continuation of application No. 10/342,228, filed on Jan. 15, 2003, now Pat. No. 6,905,942, which is a division of application No. 09/685,896, filed on Oct. 11, 2000, now Pat. No. 6,521,969.

(30) Foreign Application Priority Data

Dec. 15, 1999 (JP) ............................ 1999-355645

(51) Int. Cl.
 *H01L 29/00* (2006.01)
(52) U.S. Cl. ...................... 257/506; 257/510; 257/513; 257/E21.546
(58) Field of Classification Search ................. 257/374, 257/506, 510, 513, E21.546
See application file for complete search history.

(56) References Cited

U.S. PATENT DOCUMENTS

| | | | |
|---|---|---|---|
| 4,949,162 A | 8/1990 | Tamaki et al. | |
| 5,902,752 A | 5/1999 | Sun et al. | |
| 5,911,110 A | 6/1999 | Yu | |
| 5,976,949 A | 11/1999 | Chen | |
| 6,020,616 A * | 2/2000 | Bothra et al. | ................ 257/381 |
| 6,281,049 B1 | 8/2001 | Lee | |

FOREIGN PATENT DOCUMENTS

| | | |
|---|---|---|
| JP | 10-92921 | 4/1998 |
| JP | 1998-050146 | 9/1998 |

OTHER PUBLICATIONS

United States Office Action issued in U.S. Appl. No. 12/265,454, mailed Nov. 2, 2009.

* cited by examiner

*Primary Examiner*—Thien F Tran
(74) *Attorney, Agent, or Firm*—McDermott Will & Emery LLP

(57) ABSTRACT

In a semiconductor device having element isolation made of a trench-type isolating oxide film 13, large and small dummy patterns 11 of two types, being an active region of a dummy, are located in an isolating region 10, the large dummy patterns 11b are arranged at a position apart from actual patterns 9, and the small dummy patterns 11a are regularly arranged in a gap at around a periphery of the actual patterns 9, whereby uniformity of an abrading rate is improved at a time of abrading an isolating oxide film 13a is improved, and surface flatness of the semiconductor device becomes preferable.

25 Claims, 13 Drawing Sheets

SEMICONDUCTOR DEVICE AND METHOD OF PRODUCING THE SAME

RELATED APPLICATIONS

This application is a Continuation of U.S. application Ser. No. 11/889,101, filed Aug. 9, 2007, now U.S. Pat. No. 7,550, 815 which is a Continuation of U.S. application Ser. No. 11/135,316, filed May 24, 2005, now U.S. Pat. No. 7,304,365, which is a Continuation of U.S. application Ser. No. 10/342, 228, filed Jan. 15, 2003, now U.S. Pat. No. 6,905,942, which is a Divisional of U.S. application Ser. No. 09/685,896, filed Oct. 11, 2000, now U.S. Pat. No. 6,521,969, and claims priority of Japanese Application No. 11-355645, filed Dec. 15, 1999, the entire contents of each of which are hereby incorporated by reference.

BACKGROUND OF THE INVENTION

1. Field of the Invention

The present invention relates to a semiconductor device, in particular, an isolating oxide film in a semiconductor integrated circuit device and a pattern of an electrical active region surrounded by the isolating oxide film.

2. Discussion of Background

In recent years, in accordance with micro miniaturization and high-integration of elements of semiconductor integrated circuit devices, design rules become further specific, and a process becomes very complicated. Especially, in an element isolation, a trench-type isolating oxide film, suitable for micro miniaturization, is widely used. Therefore, it is very important to properly embed the isolating oxide film in a trench without spoiling a performance of an electrical active device region and to polish by a CMP method with high reliability.

FIG. 9 is a plan view of a conventional semiconductor device in which elements are isolated. As illustrated in FIG. 9, a pattern 1 of an electrical active device region, in which elements are formed, is arranged so as to be surrounded by an isolating region 2. Particularly, numerical reference 1a designates a micro width pattern in the electrical active device region, hereinbelow the micro width pattern is referred to as an actual micro pattern 1a.

FIGS. 10a and 10b are cross-sectional views of the conventional semiconductor device illustrated in FIG. 9, in which semiconductor device the elements are isolated. FIG. 10a is the cross-sectional view taken along a line A9-A9 in FIG. 9, in which the isolating region 2, being relatively wide, is shown. FIG. 10b is the cross-sectional view taken along a line B9-B9 in FIG. 9, wherein the actual micro pattern 1a, which is surrounded by the isolating regions 2 on both of sides, is shown.

An element isolation in a semiconductor device is formed by sequentially arranging an underlayer oxide film 4 and a nitride film 5 on a semiconductor substrate 3. Thereafter, after selectively etching to remove a part of the nitride film 5, to be the isolating region 2, the semiconductor substrate 3 is etched using a mask of the nitride film 5, whereby a trench having a predetermined depth is formed. Succeedingly, after forming an isolating oxide film 7 on an entire surface of the semiconductor substrate 3 so as to fill an inside of the trench 6, the isolating oxide film 7 is abraded by a CMP method to remove the isolating oxide film 7 on the nitride film 5 and leave the isolating oxide film 7 only inside the trench 6, whereby a trench-type isolating oxide film 7a is formed. The nitride film 5 and the underlayer oxide film 4 are removed after forming the element isolation.

However, the conventional semiconductor device has a problem that an abrading rate is decreased at around a region where the nitride film 5 is formed by an influence of the nitride film 5 because the isolating oxide film 7 on the nitride film 5 is removed by abrasion using a CMP method, the abrading rate of the nitride film 5 is low. On the contrary, in the wide isolating region 2, i.e. the trench-type isolating oxide film 7a, illustrated in FIG. 10a, the abrading rate is high, and a sink is produced in a film in its thickness direction by dishing especially in a central portion. Therefore, there are problems that a flatness of a surface is deteriorated, and a later process of patterning using a lithography technique is inappropriately patterned.

Further, as illustrated in FIG. 10b, when the actual micro pattern 1a is surrounded by the wide isolating regions 2, i.e. the trench-type isolating oxide films 7a, there is a case that a part or all of the nitride film 5 of the actual micro pattern 1a is abraded by overpolishing as illustrated in FIG. 11 because an abrading rate for the trench-type isolating oxide films 7a is high. Therefore, there are problems that the film thicknesses of the trench-type isolating oxide films 7a have further large sinks, and electrical characteristics of element are deteriorated such that a threshold value is deteriorated by an inverse narrow channel effect in properties of transistor and a leakage current is increased.

In order to improve the above-mentioned problems, in a conventional technique, a dummy pattern, being an active region of a dummy, is located in the isolating region 2 to improve uniformity of an abrading rate by a CMP method.

FIGS. 12 and 13 are plan views illustrating examples of improvement of conventional semiconductor devices, in which dummy patterns 8, i.e. active regions of a dummy, are arranged in the isolating region 2 of the semiconductor device illustrated in FIG. 9. In FIG. 12, relatively small dummy patterns 8a are bedded in the isolating region 2. In FIG. 13, relatively large dummy patterns 8b are bedded in the isolating region 2.

When the isolating oxide film 7 is abraded by the CMP method in a case illustrated in FIG. 12, an abrading rate for a region, where the small dummy patterns 8a cluster, is lowered. Accordingly, there is a case that the isolating oxide film 7 is left on the nitride film 5 of the dummy pattern 8a by under-polishing as illustrated in a cross-sectional view of FIG. 14. In this case, not only the isolating oxide film 7 but also the nitride film 5 and an underlayer oxide film 4, which are located on a lower side of the isolating oxide film 7, are not removed by a succeeding removing step, whereby flatness of a surface is extremely spoiled, and it becomes difficult to pattern in a later step.

Further, in the case illustrated in FIG. 13, because the dummy patterns 8b are large, there are areas where the dummy patterns are not arranged in a periphery of the actual pattern 1. Especially, when the dummy patterns 8b do not exist in the periphery of the actual micro pattern 1a, a cross-sectional view taken along a line B13-B13 is similar to that in FIG. 10b. As illustrated in FIG. 11, because of the high abrading rate or the trench-type isolating oxide films 7a, there is a case that a part or all of the nitride film 5 of the actual micro pattern 1a is abraded by over-polishing. Therefore, as described above, the sinks in the trench-type isolating oxide films 7a become further large, whereby electrical characteristics of element are deteriorated.

SUMMARY OF THE INVENTION

It is an object of the present invention to solve the above-mentioned problems inherent in the conventional technique and to provide a semiconductor device with an element isolation, made of a trench-type isolating oxide film formed in an isolating region, wherein over-polishing and under-polishing are restricted by improving uniformity of an abrading rate at time of abrading the isolating oxide film by a CMP method, whereby the semiconductor device has a preferable surface flatness and high reliability.

According to a first aspect of the present invention, there is provided a semiconductor device comprising:

a semiconductor substrate;

electrical active device regions formed in the semiconductor substrate; and an isolating region made of a trench-type isolating oxide film, of which surface is abraded by a CMP method, wherein a plurality of types of dummy patterns having various areas, being active regions of a dummy surrounded by the trench-type isolating oxide film patterns, are located in the isolating region so that the trench-type isolating oxide film pattern does not exceed a predetermined width, and the dummy patterns are regularly arranged by setting an area in response to a positional relationship between the dummy patterns and patterns of the electrical active device regions.

According to a second aspect of the present invention, there is provided the semiconductor device according to the first aspect of the invention, wherein relatively large dummy patterns are arranged from a position apart from the electrical active device patterns to the electrical active device patterns, and relatively small dummy patterns are inserted in a gap around the electrical active device pattern.

According to a third aspect of the present invention, there is provided the semiconductor device according to the first aspect of the invention, wherein dummy patterns having relatively small areas are arranged around the electrical active device patterns, and dummy patterns having relatively large areas are arranged around the dummy patterns having the relatively small areas.

According to a fourth aspect of the present invention, there is provided the semiconductor device according to the first through third aspects of the invention, wherein dummy patterns are arranged on both sides of micro width patterns of an electrical active device interposing the trench-type isolating oxide film patterns, and the widths of the trench-type isolating oxide film patterns are about one through ten times of the micro width pattern.

According to a fifth aspect of the present invention, there is provided a method of producing the semiconductor device comprising:

a first step of forming a trench of a predetermined depth in a predetermined region in an isolating region after forming a nitride film on a semiconductor substrate interposing an oxide film, and forming a trench region and an active region of a dummy, to be a dummy pattern, in the isolating region;

a second step of depositing an isolating oxide film on an entire surface so as to till the trench;

a third step of selectively etching to leave the isolating oxide film larger than predetermined pattern dimensions in a dummy pattern region so as to have a predetermined width in an end region of the pattern; and a fourth step of abrading to remove the isolating oxide film in the nitride film by a CMP method.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein.

DETAILED DESCRIPTION OF THE PREFERRED EMBODIMENTS

A detailed explanation will be given of preferred embodiments of the present invention in reference to FIGS. 1 through 8b as follows, wherein the same numerical references are used for the same or similar portions and descriptions of these portions is omitted.

Embodiment 1

Hereinbelow, Embodiment 1 of the present invention will be described in reference of figures.

Figure 1:
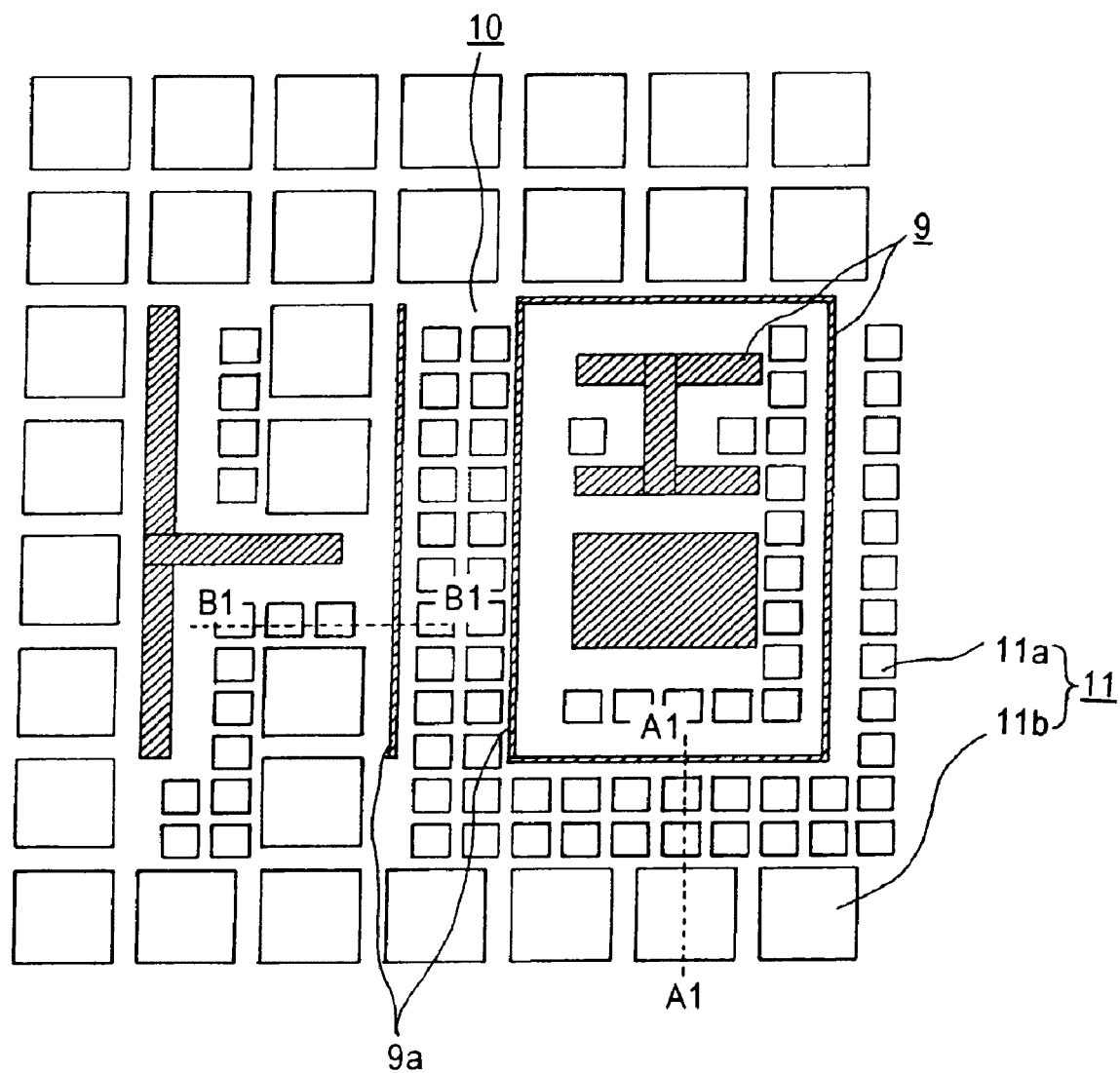
FIG. 1 is a plan view of a semiconductor device according to Embodiment 1 of the present invention.
Figure 2A:
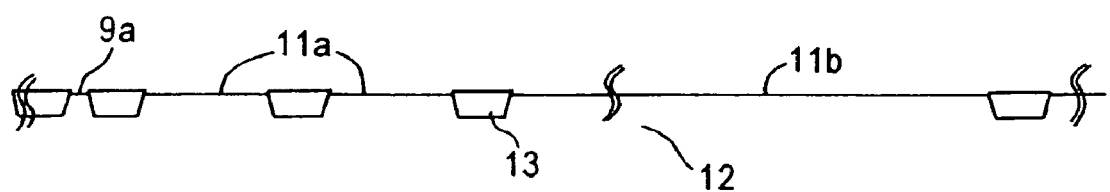
FIG. 2a is a cross-sectional view of the semiconductor device according to Embodiment 1 of the present invention.
Figure 2B:
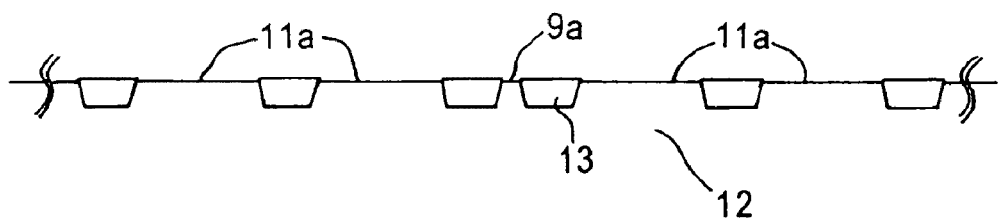
FIG. 2b is a cross-sectional view of the semiconductor device according to Embodiment 1 of the present invention.

FIG. 1 is a plan view of a semiconductor device according to Embodiment 1 of the present invention. FIG. 2a is a cross-sectional view of semiconductor device taken along a line A1-A1 in FIG. 1. FIG. 2b is a cross-sectional view of semiconductor device taken along a line B1-B1. In the figures, numerical reference 9 designates a pattern, hereinbelow referred to as an actual pattern 9, of an electric active device region, in which elements are formed, wherein the actual patterns 9 are surrounded by an isolating region 10. Particularly, numerical reference 9a designates a micro width pattern, hereinbelow referred to as an actual micro pattern 9a, of the electric active device region. Numerical reference 11 designates a dummy pattern being an active region of a dummy arranged inside the isolating region 10. Numerical reference 11a designates a relatively small dummy pattern. Numerical reference 11b designates a relatively large dummy pattern. Numerical reference 12 designates a semiconductor substrate, and numerical reference 13 designates a trench-type isolating oxide film.

As illustrated in FIGS. 1 through 2b, the dummy patterns 11 of two types, i.e. the dummy patterns 11a and 11b, having different areas are arranged in the isolating region surrounding the actual pattern 9. The dummy patterns 11 are arranged such that the large dummy patterns 11b are regularly arranged from a region apart from the actual pattern 9 to a neighbor of the actual pattern 9 so as to be bedded. For example, dummy patterns 11b of a 18 μm square are arranged at a pitch of 20 μm. In a periphery of the actual pattern 9, which is a gap where the large dummy patterns 11b are not arranged, the small dummy patterns 11a are inserted and regularly arranged. For example, dummy patterns 11a of a 3 μm square are arranged at a pitch of 5 μm.

Figure 3A:
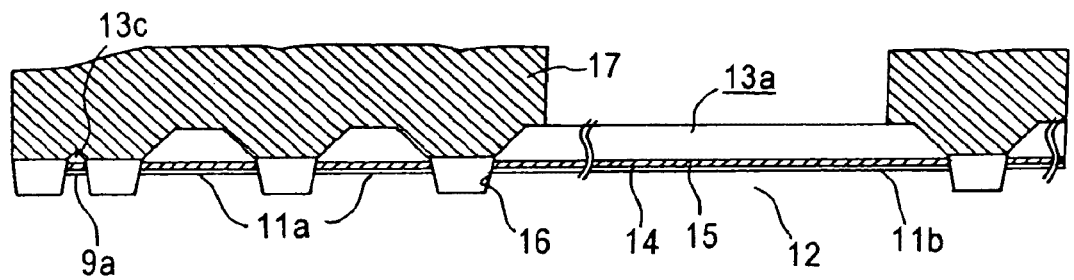
FIG. 3a is a cross-sectional view for illustrating a method of producing the semiconductor device according to Embodiment 1 of the present invention.
Figure 3B:
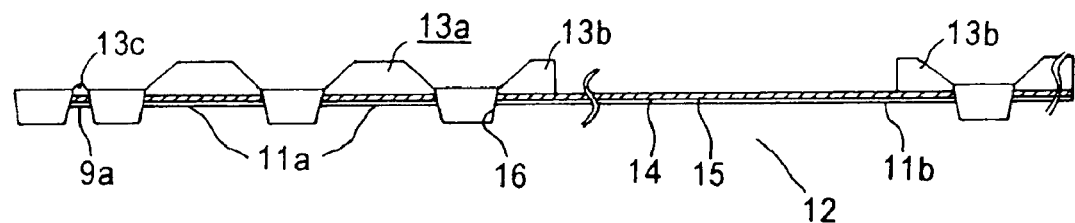
FIG. 3b is a cross-sectional view for illustrating the method of producing the semiconductor device according to Embodiment 1 of the present invention.
Figure 3C:
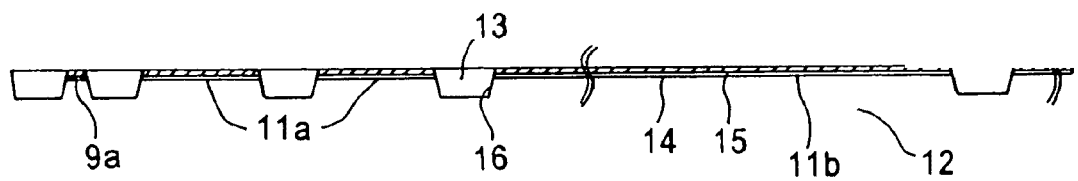
FIG. 3c is a cross-sectional view for illustrating the method of producing the semiconductor device according to Embodiment 1 of the present invention.
Figure 4A:
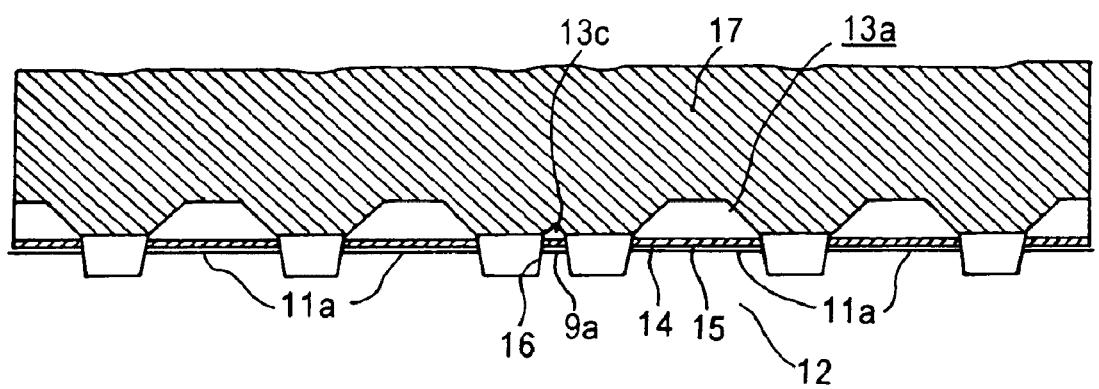
FIG. 4a is a cross-sectional view for illustrating a method of producing the semiconductor device according to Embodiment 1 of the present invention.
Figure 4B:
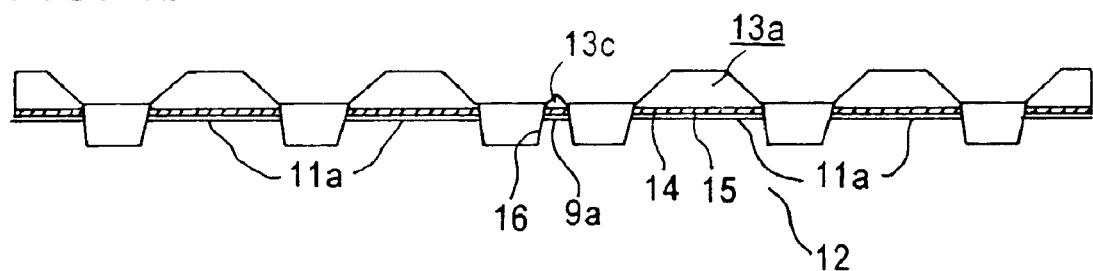
FIG. 4b is a cross-sectional view for illustrating the method of producing the semiconductor device according to Embodiment 1 of the present invention.
Figure 4C:
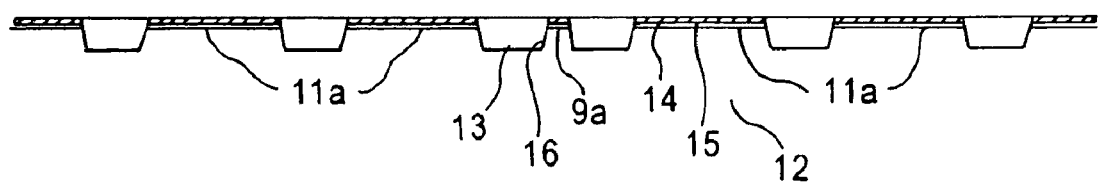
FIG. 4c is a cross-sectional view for illustrating the method of producing the semiconductor device according to Embodiment 1 of the present invention.

A step of isolating elements in the semiconductor device will be described in reference of FIGS. 3a through 4c. FIGS. 3a through 3c are cross-sectional views of a portion illustrated in FIG. 2a for illustrating a manufacturing process thereof. FIGS. 4a through 4c are cross-sectional views of a portion illustrated in FIG. 2b for illustrating a manufacturing process thereof.

At first, an underlayer oxide film 14, for example, of a film thickness of about 10 nm, is formed on the semiconductor substrate including a p-type single crystal silicon having a specific resistance of, for example, 10Ω·cm. Further, a nitride film 15 of a film thickness of about 0.1 μm is further formed. Thereafter, after selectively etching to remove a portion of the nitride film 15 other than active regions 9 and 11 in the actual pattern 9 and the dummy patterns 11, the semiconductor substrate 12 is etched in a depth direction by about 0.3 μm using a mask of the nitride film 15, whereby the trench 16 is formed. Succeedingly, an inside of the trench 16 is buried, and an isolating oxide film 13a having a film thickness of, for example, about 0.4 μm including high density plasma (HDP) oxide film is deposited on an entire surface. Thereafter, a resist pattern 17 is formed on the isolating oxide film 13a to etch the isolating oxide film 13a in the active regions 9 and 11, wherein the resist pattern 17 is larger than a predetermined dimensions of the pattern. The resist pattern 17 is undersized by, for example, about 1.5 μm with respect to the active regions 9 and 11 to be processed as illustrated in FIGS. 3a and 4a.

In the next, the isolating oxide film 13a is etched to be opened to reach the nitride film 15 using the resist pattern 17 as a mask. Accordingly, the relatively wide active regions 9 and 11, i.e. the isolating oxide film 13a on the region of the large dummy patterns 11b and the relatively wide actual pattern 9 is opened at a central portion thereof, whereby only end portions 13b are left. The etching may be a dry-etching or a wet-etching. An HDP oxide film 13c formed on the actual micro pattern 9a is shaped like a small triangle as illustrated in FIGS. 3a through 4c. For example, in a clustered region of the actual micro pattern 9a, such as a memory cell of a DRAM portion, are a large number of the HDP oxide films 13c of the small rectangular shape are clustered as in FIGS. 3b and 4b.

In the next, the isolating oxide film 13a is abraded by a CMP method, the isolating oxide film 13a on the nitride film 15 is removed, and the isolating oxide film 13a is left only in the trench 16, whereby the trench-type isolating oxide film 13 is formed as illustrated in FIGS. 3c and 4c.

In the next, the nitride film 15 and the underlayer oxide film 14 are sequentially removed by wet-etching, and a predetermined process is provided, whereby the element isolation illustrated in FIGS. 2a and 2b is completed.

In Embodiment 1, the large dummy patterns 11b are regularly arranged from the region apart from the actual pattern 9 so as to bed thereon, and the small dummy patterns 11a are regularly arranged so as to be inserted in the region of the gap around the actual pattern 9 where the large dummy patterns 11b can not be arranged. Accordingly, the width of the trench-type isolating oxide film 13 does not exceed the predetermined width. Therefore, it is possible to suppress an increment of the abrading rate when the isolating oxide film 13a is abraded by the CMP method, whereby a sink of the film in the thickness direction by dishing can be prevented.

Further, because the width of the trench-type isolating oxide film 13 on the both sides of the actual micro pattern 9a can be reduced by inserting the small dummy patterns 11a, it is possible to prevent abrasion of the nitride film 15 of the actual micro pattern 9a caused by overpolishing, and a sink of the film in its thickness direction of the adjacent trench-type isolating oxide film 13a can be prevented, whereby a drop of a threshold value by an adverse narrow channel effect in properties of transistor, and deterioration of electrical characteristics of elements, such as an increment of a leakage current, can be prevented. The width of the trench-type isolating oxide film 13 on the both sides of the actual micro pattern 9a is preferably about one through ten times of that of the actual micro pattern 9a, wherein uniformity of the abrading rate by the CMP method is improved, and the above-mentioned effects are securely obtainable.

Further, by arranging the large dummy patterns 11b and the small dummy patterns 11a, the small dummy patterns 11a are not partly clustered, whereby the uniformity of the abrading rate by the CMP method is improved, and it is possible to prevent the isolating oxide film 13a from remaining on the nitride film by underpolishing. The isolating oxide film 13a on the large dummy patterns 11b and the relatively wide actual pattern 9 as the opening at the center thereof by pre-etching performed before the abrading step by the CMP method, whereby the isolating oxide film 13a is easily abraded, and problems caused by underpolishing do not occur.

Further, a dominating ratio of the dummy patterns 11 and the isolating oxide film 13a of the active regions 9 and 11 with respect to an entire area is in a range of about 50 through 80%, which is in a level similar to that in the region where the actual patterns 9 are clustered. Accordingly, uniformity of the abrading rate by the CMP method is further improved on an entire surface of the semiconductor substrate 12.

As described, in Embodiment 1, because the uniformity of the abrading rate is improved when the isolating oxide film 13a is abraded by the CMP method when the elements are isolated, it is possible to obtain the semiconductor device with preferable surface flatness and high reliability.

The dimensions of the small dummy patterns 11a are appropriately set within a range of 1 through 100 times of the minimum dimensions of the actual patterns 9. The dimensions of the large dummy patterns 11b are appropriately set within a range of 10 through 1,000 times of the minimum dimension of the actual patterns 9. The dummy patterns 11, i.e. the small dummy patterns 11a and the large dummy patterns 11b, may be shaped like not only a rectangular but also a strap, a hook, and lines and spaces as long as the dummy patterns are regularly arranged to facilitate a control of process.

Further, although the resist pattern 17 being a pre-etching mask for the isolating oxide film 13a is under-sized by about 1.5 μm with respect to the active region of the resist pattern 17 being the pre-etching mask, the extent of the undersize is not limited thereto as long as the isolating oxide film 13a is left in the end portions of active region after pre-etching.

Further, although the isolating oxide film 13a is pre-etched to the surface of the nitride film 15, it is possible to stop the pre-etching before reaching the surface and succeedingly adjust etching in the abrading step by the CMP method.

Embodiment 2

In the next, a structure that the element isolation of the semiconductor illustrated in FIGS. 1 through 2b according to Embodiment 1 is realized using a TEOS oxide film as an isolating oxide film will be described below in reference of FIGS. 5a through 6c.

Figure 5A:
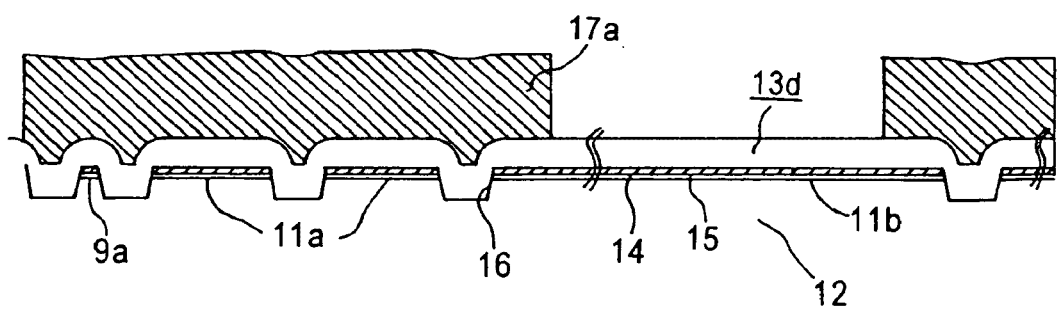
FIG. 5a is a cross-sectional view for illustrating a method of producing a semiconductor device according to Embodiment 2 of the present invention.
Figure 5B:
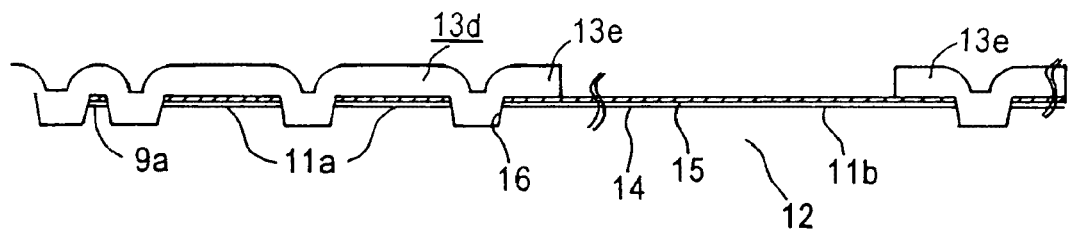
FIG. 5b is a cross-sectional view for illustrating the method of producing the semiconductor device according to Embodiment 2 of the present invention.
Figure 5C:
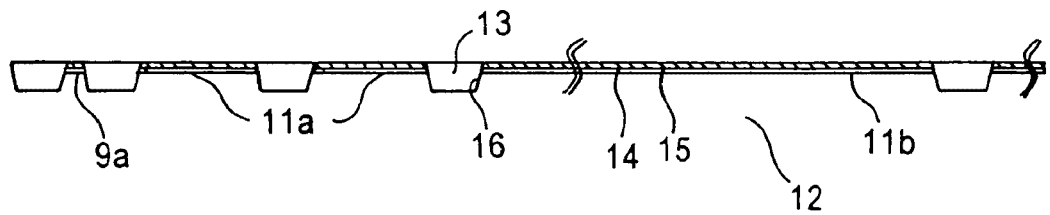
FIG. 5c is a cross-sectional view for illustrating the method of producing the semiconductor device according to Embodiment 2 of the present invention.
Figure 6A:
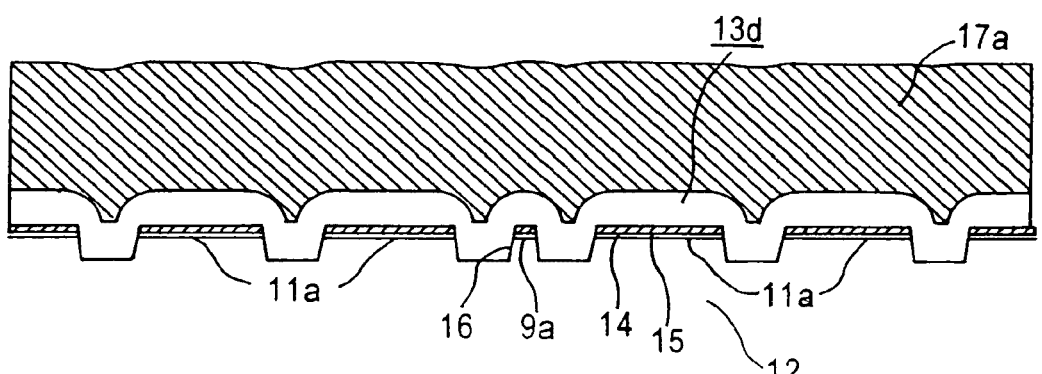
FIG. 6a is a cross-sectional view for illustrating a method of producing the semiconductor device according to Embodiment 2 of the present invention.
Figure 6B:
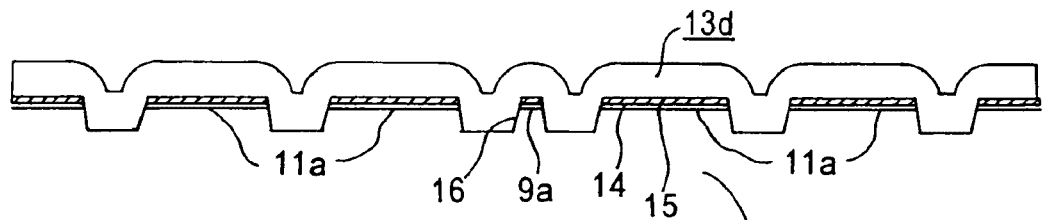
FIG. 6b is a cross-sectional view for illustrating the method of producing the semiconductor device according to Embodiment 2 of the present invention.
Figure 6C:
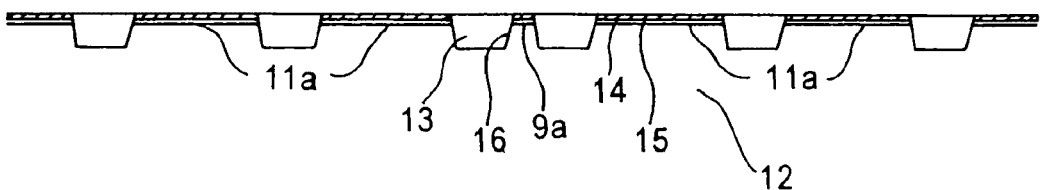
FIG. 6c is a cross-sectional view for illustrating the method of producing the semiconductor device according to Embodiment 2 of the present invention.

FIGS. 5a through 5c illustrate cross-sectional views of a portion corresponding to that in FIG. 2a. FIGS. 6a through 6c illustrate cross-sectional views of a portion corresponding to that in FIG. 2b for explaining element isolating steps.

In a similar manner to that in Embodiment 1, after forming an underlayer oxide film 14 and a nitride film 15 on the semiconductor substrate 12, a part of the oxide film other than an actual patterns 9 and an active region 9 of dummy patterns 11 is selectively etched to remove, and a trench 16 is formed on the semiconductor substrate 12 using a mask of the nitride film 15.

Succeedingly, after depositing an isolating oxide film 13d made of a TEOS oxide film on an entire surface so as to embed an inside of the trench 16, a resist pattern 17a is formed on the isolating oxide film 13d. The resist pattern 17a is formed as a mask pattern for etching the isolating oxide film 13d in a region where actual micro patterns 9a, such as the active regions 9 and 11, being larger than predetermined pattern dimensions and memory cells in a DRAM portion cluster, wherein the resist pattern 17a is under-sized by, for example, about 1.5 μm with respect to a region to be processed, as illustrated in FIGS. 5a and 6a.

In the next, the isolating oxide film 13d is etched to open in a predetermined depth, where a surface of the nitride film 15 is not exposed, using the resist pattern 17a as the mask. Accordingly, the relatively wide active regions 9 and 11, i.e. the isolating oxide film 13d in a region where the large dummy patterns 11b, the relatively wide actual patterns 9, and the actual micro patterns 9a are clustered, are opened to an extent that the underlayer nitride film 15 is not exposed at a central portion, whereby an end portion 13e is left. The etching may be dry-etching or wet-etching as in FIGS. 5b and 6b. Thereafter, in a similar manner to that in Embodiment 1, the isolating oxide film 13d is abraded by a CMP method to remove a part of the isolating oxide film 13d on the nitride film 15 and leave the isolating oxide film 13d only inside the trench 16, whereby a trench-type isolating oxide film 13 is formed as illustrated in FIGS. 5c and 6c.

In the next, the nitride film 15 and the under layer oxide film 14 are sequentially removed by wet-etching, and provided with a predetermined process, whereby the element isolation illustrated in FIGS. 2a and 2b is completed.

In Embodiment 2, in a manner similar to Embodiment 1, because uniformity of the abrading rate is improved at time of abrading the isolating oxide film 13d for forming the element isolation by the CMP method, it is possible to obtain a semiconductor device having preferable surface flatness and high reliability.

Further, the isolating oxide film 13d made of the TEOS oxide film is subjected to pre-etching not only in the relatively wide active regions 9 and 11 but also in the region with the clustered actual micro patterns 9a. This is because, the film thickness of the TEOS oxide film 13d is not decreased on the actual micro patterns 9a, the TEOS oxide film 13d on the actual micro patterns 9a has a large area by extending to an upper layer of adjacent trenches 16 in the region with the clustered actual micro patterns 9a, and therefore underpolishing is apt to occur at time of abrading by the CMP method.

Embodiment 3

In the next, Embodiment 3 of the present invention will be described.

Figure 7:
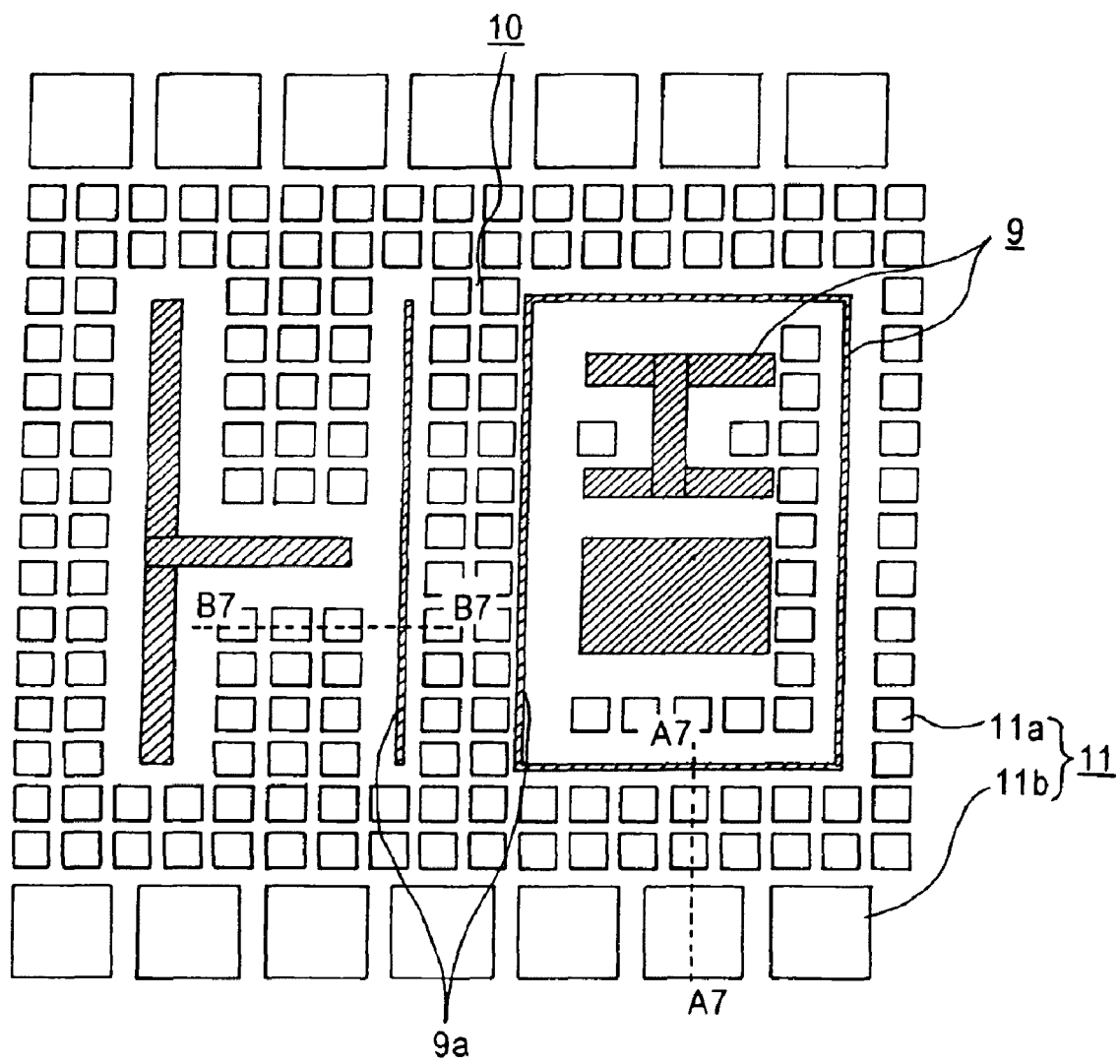
FIG. 7 is a plan view of a semiconductor according to Embodiment 3 of the present invention.
Figure 8A:
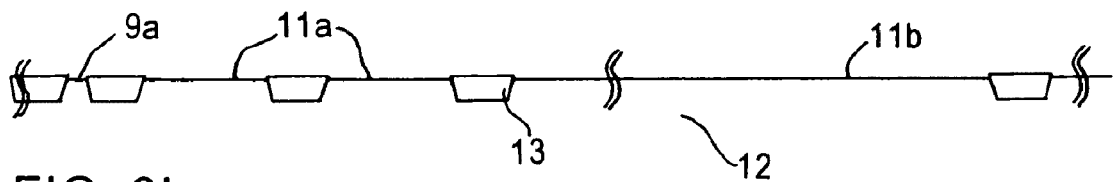
FIG. 8a is a cross-sectional view of the semiconductor device illustrated in FIG. 7.
Figure 8B:
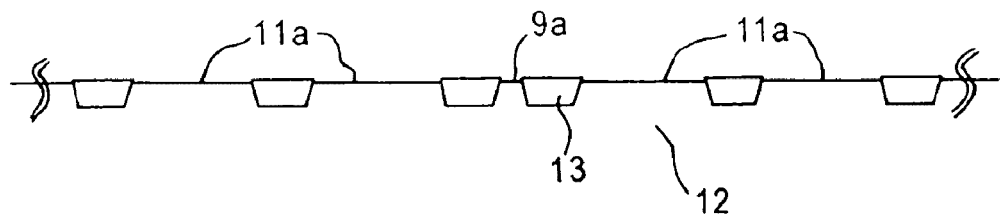
FIG. 8b is a cross-sectional view of the semiconductor device illustrated in FIG. 7.
Figure 9:
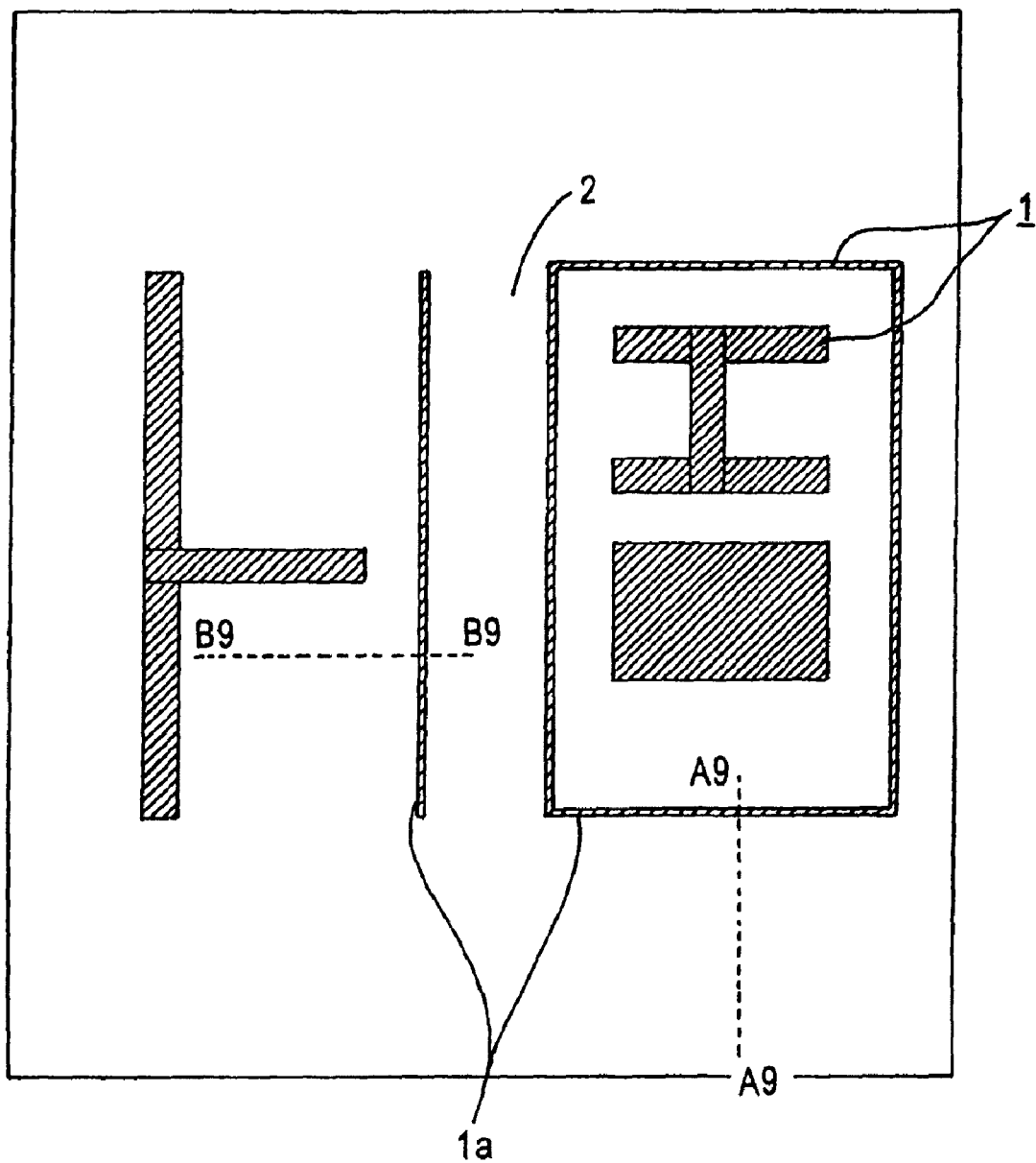
FIG. 9 is a plan view of a conventional semiconductor device.
Figure 10A:
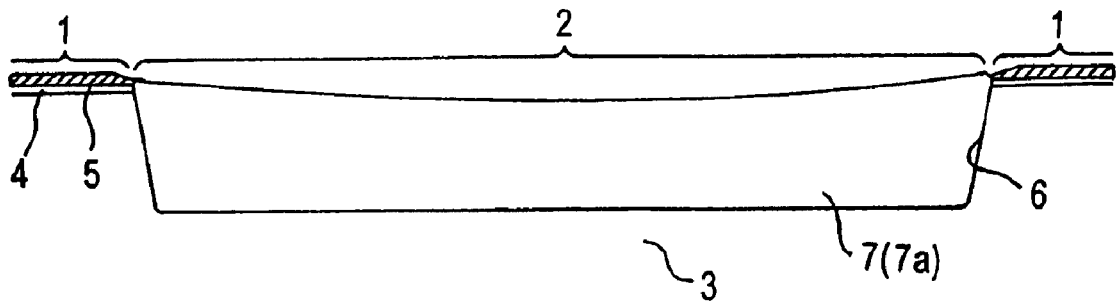
FIG. 10a is a cross-sectional view of the conventional semiconductor device.
Figure 10B:
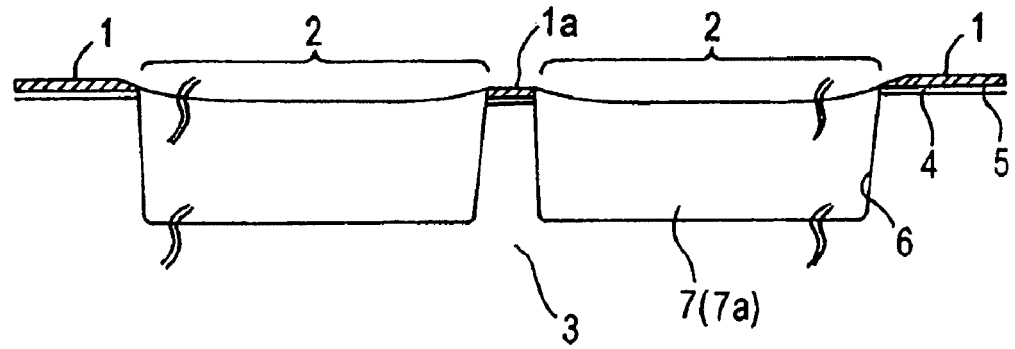
FIG. 10b is a cross-sectional view of the conventional semiconductor device.
Figure 11:
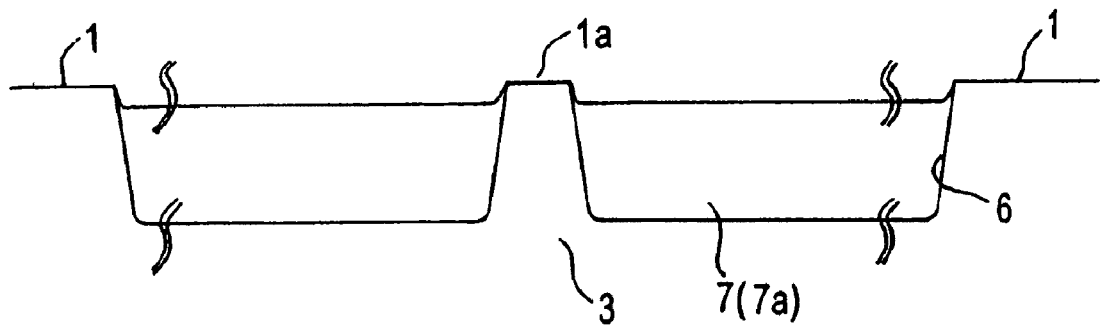
FIG. 11 is a cross-sectional view for illustrating problems in the conventional semiconductor device.
Figure 12:
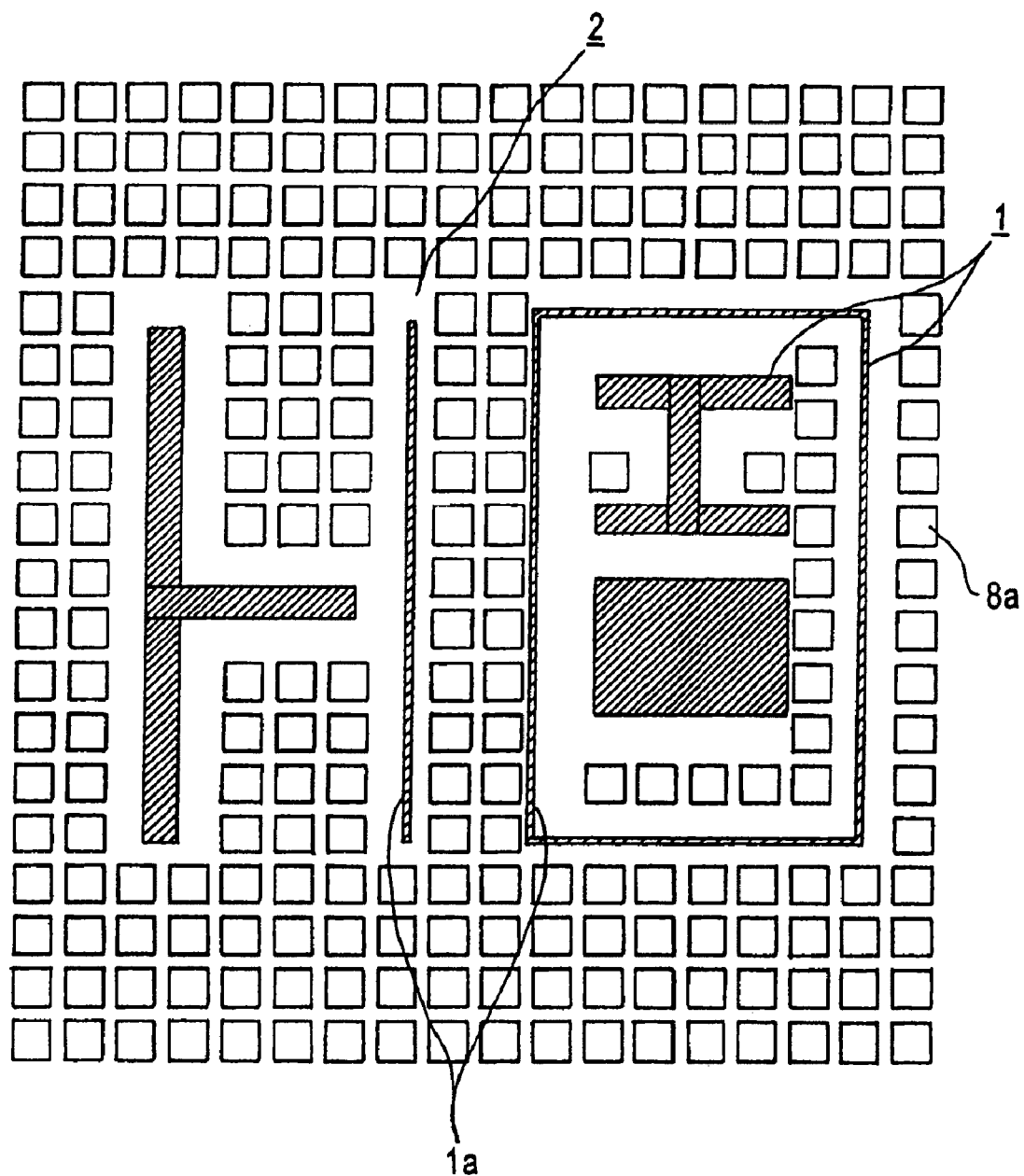
FIG. 12 is a plan view of another conventional semiconductor device.
Figure 13:
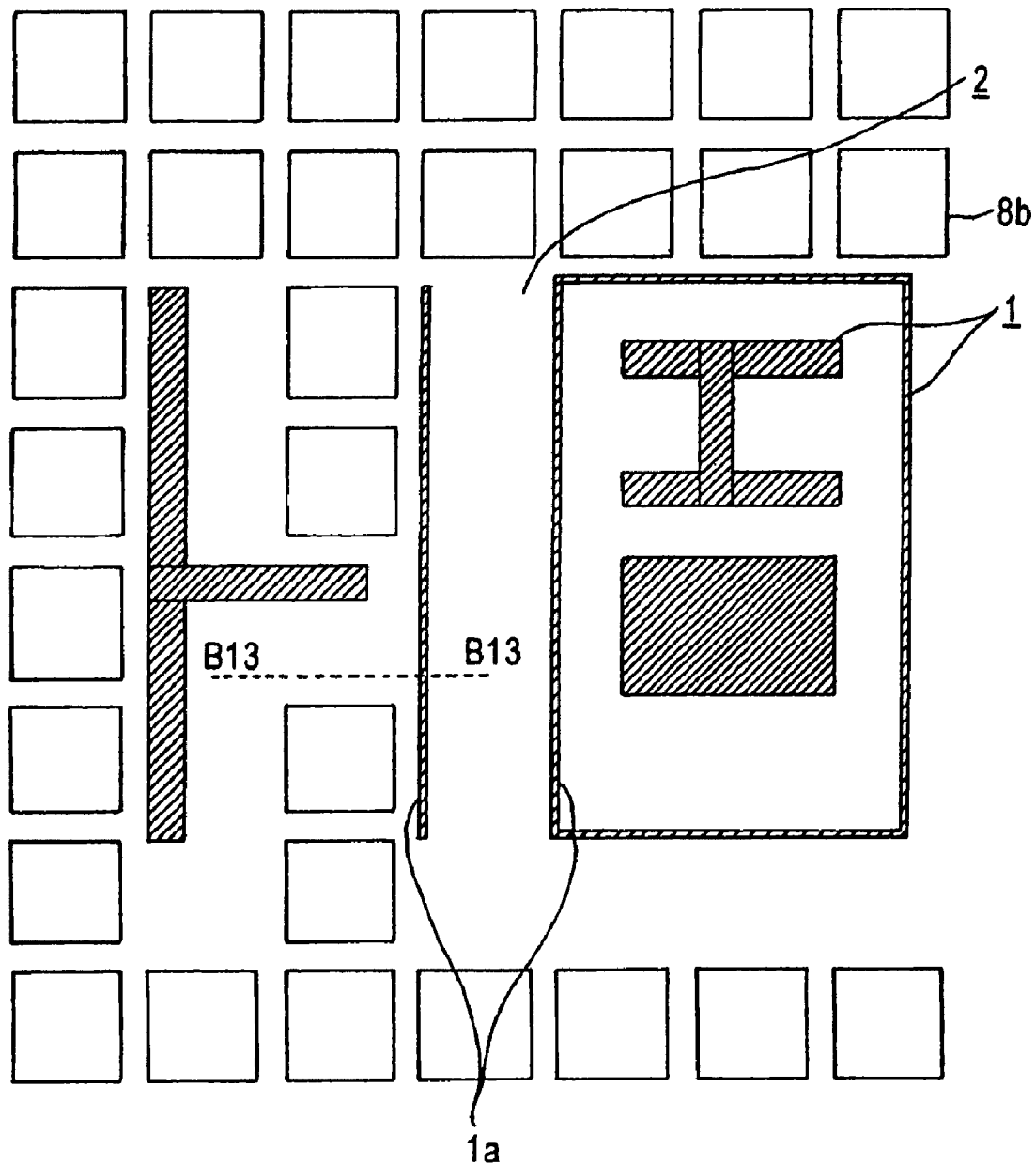
FIG. 13 is a plan view of another conventional semiconductor device.
Figure 14:
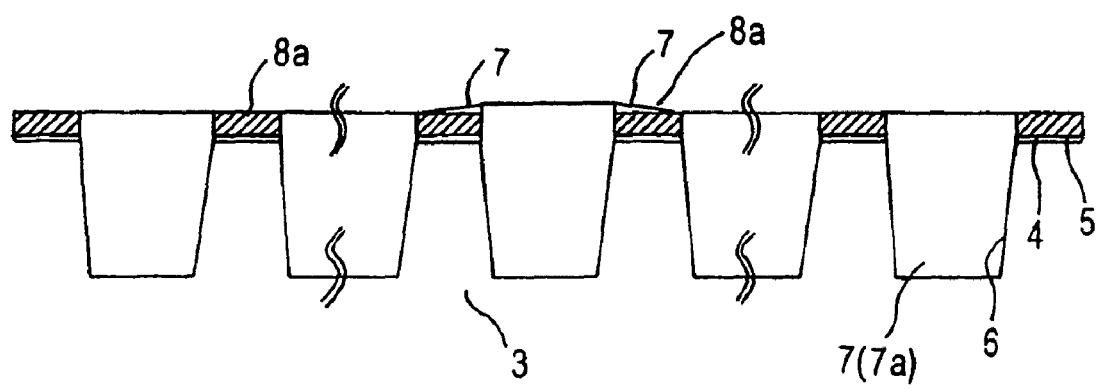
FIG. 14 is a cross-sectional view of the semiconductor device illustrated in FIG. 12.

FIG. 7 is a plan view of a semiconductor device according to Embodiment 3 of the present invention. FIG. 8a is a cross-sectional view taken along a ling A7-A7 in FIG. 7. FIG. 8b is a cross-sectional view taken along a ling B7-B7 in FIG. 7.

As illustrated in the figures, two types of dummy patterns 11, i.e. 11a and 11b, having different areas are arranged in an isolating region 10 surrounding actual patterns 9. The dummy patterns 11 are arranged such that the small dummy patterns 11a are regularly arranged in a periphery of the actual patterns 9, for example, dummy patterns 11a of a 3 μm square is arranged at a pitch of 5 μm.

In a periphery of the actual patterns 9 and the small dummy patterns 11a surrounding the actual pattern 9, the large dummy patterns 11b are regularly arranged so as to be bedded. For example, dummy patterns 11h of a 18 μm square are arranged at a pitch of 20 μm.

An element isolating process of the semiconductor device is conducted in a manner similar to that in Embodiment 1 when an HDP oxide film 13a is used as the isolating oxide film as illustrated in FIGS. 3a through 4c, or in a manner similar to that in Embodiment 2 when the TEOS oxide film 13d is used as the isolating oxide film as illustrated in FIGS. 5a through 6c.

In Embodiment 3, because the small dummy patterns 11a are arranged in the periphery of the actual patterns 9, and the large dummy patterns 11b are regularly arranged around the small dummy patterns 11a, the width of a trench-type isolating oxide film 13 does not exceed a predetermined width. Therefore, when an isolating oxide film 13a and/or 13d is abraded by a CMP method, it is possible to suppress an increment of an abrading rate, and prevent a sink of a film thickness by dishing.

Further, because the width of the trench-type isolating oxide film 13 on the both sides of the actual micro pattern 9a is made small because the small dummy patterns 11a are arranged in the periphery thereof, it is possible to prevent the nitride film 15 of the actual micro patterns 9a from being abraded by overpolishing, whereby electrical characteristics of element are not deteriorated. Further, by arranging the large dummy patterns 11b and the small dummy patterns 11a, the small dummy patterns 11a are not clustered, and underpolishing is prevented. The isolating oxide film 13a and/or 13d on a region of the large dummy patterns 11b and the relatively wide actual patterns 9 as an opening at a central portion thereof by pre-etching performed before the abrading step by the CMP method, whereby it is possible to easily abrade, and problems caused by the underpolishing can be prevented.

As described, in Embodiment 3, as in Embodiments 1 and 2, because uniformity of the abrading rate is improved when the isolating oxide film 13a and/or 13d is abraded by the CMP method at time of isolating elements, a semiconductor device with preferable surface flatness and high reliability is obtainable.

In Embodiments 1 through 3, the two types of the dummy patterns 11, which are large and small, are used. However, the types may be three or more. In this case, as in Embodiment 1, the largest dummy patterns 11 are arranged at a position apart from an actual pattern 9, and smaller dummy patterns 11 are arranged toward the actual pattern 9, or as in Embodiment 3, the smallest dummy patterns 11 is arranged in a periphery of an actual pattern 9, and larger dummy patterns 11 are arranged toward a position apart from the actual pattern.

As such, by setting areas of the dummy patterns 11 in accordance with positional relationships between the actual patterns 9 and the dummy patterns 11 for an arrangement, and suppressing an unnecessary increment of the width of the trench-type isolating oxide film 13, the uniformity of the abrading rate is improved at time of abrading the isolating oxide films 13a and/or 13d, and the semiconductor device with preferable surface flatness and high reliability is obtainable.

The first advantage of the semiconductor device according to the present invention is that uniformity of an abrading rate can be improved at time of abrading the isolating oxide film by a CMP method, surface flatness is preferable, and reliability becomes high.

The second advantage of the semiconductor device according to the present invention is that electrical characteristics of elements are not deteriorated, and simultaneously surface flatness becomes preferable and reliability is high.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 11-355645 filed on Dec. 15, 1999 including specification, claims, drawings and summary are incorporated herein by reference in its entirety.

What is claimed is:

1. A semiconductor device comprising:
a semiconductor substrate;
an active device region formed on a principal surface of the semiconductor substrate;
an isolating region surrounding the active device region;
a plurality of first active dummy patterns having the same plane shape and arranged at a first pitch in a first direction and a second direction different from the first direction in a region of the isolating region adjacent to the active device region; and
a plurality of second active dummy patterns having the same plane shape and arranged at a second pitch in a third direction and a fourth direction different from the third direction in a region of the isolating region more distant than the first active dummy patterns from the active device region;
wherein the first pitch is smaller than the second pitch, any one of plane areas of the first active dummy patterns is smaller than any one of plane areas of the second active dummy patterns, and any two of plane areas of the second active dummy patterns adjacent to the first active dummy patterns are equal with each other.

2. The semiconductor device according to claim 1, wherein the isolating region is constituted by an oxide film in a trench in the principal surface of the semiconductor substrate.

3. The semiconductor device according to claim 2, wherein the first and the second active dummy patterns are each surrounded by the oxide film.

4. The semiconductor device according to claim 1, wherein the first direction is the same as the third direction, the second direction is the same as the fourth direction, and a shape of each of the first active dummy patterns is analogous to a shape of each of the second active dummy patterns.

5. A semiconductor device comprising:
a semiconductor substrate;
a first active device region for a memory cell and a second active device region for other than a memory cell that are formed on a principal surface of the semiconductor substrate;
an isolating region formed between and around the first and the second active device regions;
a plurality of first active dummy patterns having the same plane shape and arranged at a first pitch in a first direction and a second direction different from the first direction in the isolating region; and
a plurality of second active dummy patterns having the same plane shape and arranged at a second pitch in a third direction and a fourth direction different from the third direction in the isolating region;
wherein the first pitch is smaller than the second pitch, and any one of plane areas of the first active dummy patterns is smaller than any one of plane areas of the second active dummy patterns.

6. The semiconductor device according to claim 5, wherein the isolating region is constituted by an oxide film in a trench in the principal surface of the semiconductor substrate.

7. The semiconductor device according to claim 6, wherein the first and the second active dummy patterns are each surrounded by the oxide film.

8. The semiconductor device according to claim 5, wherein the first and the second active device regions are arranged so that the first active dummy patterns are closer than the second active dummy patterns to the first and the second active device regions.

9. The semiconductor device according to claim 5, wherein the first direction is the same as the third direction, the second direction is the same as the same as the fourth direction, and a shape of the first active dummy pattern is analogous to a shape of the second active dummy pattern.

10. A semiconductor device comprising:
a semiconductor substrate;
a first active device region and a second active device region formed on a principal surface of the semiconductor substrate;
an isolating region formed between the first and the second active device regions;
a plurality of first active dummy patterns having the same plane shape and arranged at a first pitch in a first direction in the isolating region;
a plurality of second active dummy patterns having the same plane shape and arranged at a second pitch in a second direction in the isolating region; and
a plurality of third active dummy patterns having the same plane shape and arranged at the first pitch in the first direction in the isolating region;
wherein the first pitch is smaller than the second pitch, any one of plane areas of the first active dummy patterns is smaller than any one of plane areas of the second active dummy patterns, and any one of plane areas of the third active dummy patterns is smaller than any one of plane areas of the second active dummy patterns;
the first active device region, the first active dummy patterns, the second active dummy patterns, the third active dummy patterns and the second active device region are arranged in this order; and
each of the first active dummy patterns have the same plane area, each of the third active dummy patterns have the same plane area, and the plane area of the first active dummy pattern is equal to the plane area of the third active dummy pattern.

11. The semiconductor device according to claim 10, wherein the isolating region is constituted by an oxide film in a trench in the principal surface of the semiconductor substrate.

12. The semiconductor device according to claim 11, wherein the first, the second and the third active dummy patterns are each surrounded by the oxide film.

13. The semiconductor device according to claim 10, wherein a shape of the first active dummy pattern is analogous to a shape of the third dummy pattern.

14. The semiconductor device according to claim 10, wherein the first direction is the same as the second direction, and shapes of the first active dummy patterns, the second active dummy patterns and the third active dummy patterns are analogous to one another.

15. A semiconductor device comprising;
a semiconductor substrate;
a first active device region and a second active device region group formed on a principal surface of the semiconductor substrate;
an isolating region formed between the first active device region and the second active device region group;
a plurality of first active dummy patterns having the same plane shape and arranged at a first pitch in a first direction in the isolating region;
a plurality of second active dummy patterns having the same plane shape and arranged at a second pitch in the second direction in the isolating region; and a plurality of third active dummy patterns having the same plane shape and arranged at the first pitch in the first direction in the isolating region;
wherein the first pitch is smaller than the second pitch, any one of plane areas of the first active dummy patterns is smaller than any one of plane areas of the second active dummy patterns, and any one of plane areas of the third active dummy patterns is smaller than any one of the plane areas of the second active dummy patterns;
the first active device region, the first active dummy patterns, the second active dummy patterns, the third active dummy patterns and the second active device region group are arranged in this order; and
any two of the plane areas of the plurality of first active dummy patterns are equal with each other and any two of the plane areas of plurality of third active dummy patterns are equal with each other.

16. The semiconductor device according to claim 15, wherein the second active device group has two active device regions.

17. A semiconductor device according to claim 15, wherein the isolating region is constituted by an oxide film in a trench in the principal surface of the semiconductor substrate.

18. The semiconductor device according to claim 17, wherein the first, the second and the third active dummy patterns are each surrounded by the oxide film.

19. The semiconductor device according to claim 15, wherein a plane shape each of the first active dummy patterns is the same as a plane shape of each of the third active dummy patterns.

20. A semiconductor device comprising:
a semiconductor substrate;
an active device region formed on a principal surface of the semiconductor substrate;
an isolating region formed around the active device region;
a plurality of first active dummy patterns arranged at a first pitch in the isolating region; and
a plurality of second active dummy patterns arranged at a second pitch in the isolating region;
wherein a plurality of the first active dummy patterns having the same plane shape are arranged at the first pitch in a first direction so as to be adjacent to the active device region;
a plurality of the first active dummy patterns having the same plane shape are arranged at the first pitch in a second direction so as to be the adjacent to the active device region,
a plurality of the second active dummy patterns having the same plane shape are arranged at the second pitch in the first direction so as to be adjacent to the plurality of first active dummy patterns arranged in the first direction,
a plurality of the second active dummy patterns having the same plane shape are arranged at the second pitch in the second direction so as to be adjacent to the plurality of first active dummy patterns arranged in the second direction; and
the first pitch is smaller than the second pitch, any one of plane areas of the first active dummy patterns is smaller than any one of plane areas of the second active dummy patterns, any two of the plurality of second active dummy patterns arranged in the first and the second directions have the same plane shape and the same plane area with each other, and the first direction and the second direction are different from each other.

21. The semiconductor device according to claim 20, wherein the isolating region is constituted by an oxide film in a trench in a principle surface of the semiconductor substrate.

22. The semiconductor device according to claim 21, wherein the first and the second active dummy patterns are each surrounded by the oxide film.

23. The semiconductor device according to claim 20, wherein the active device region is arranged so that the first active dummy patterns are closer than the second active dummy patterns to the active device region.

24. The semiconductor device according to claim 20, wherein a shape of the first active dummy pattern is analogous to a shape of the second active dummy pattern.

25. The semiconductor device according to claim 20, wherein any two of the plurality of first active dummy patterns have the same plane area with each other, and any two of the plurality of the second active dummy patterns have the same plane area with each other.

* * * * *